United States Patent
Xu

(10) Patent No.: US 11,404,504 B2
(45) Date of Patent: Aug. 2, 2022

(54) DISPLAY PANEL AND METHOD OF MANUFACTURING THE SAME

(71) Applicant: Shenzhen China Star Optoelectronics Semiconductor Display Technology Co., Ltd., Shenzhen (CN)

(72) Inventor: Ming Xu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 350 days.

(21) Appl. No.: 16/626,587

(22) PCT Filed: Dec. 18, 2019

(86) PCT No.: PCT/CN2019/126175
§ 371 (c)(1),
(2) Date: Dec. 26, 2019

(87) PCT Pub. No.: WO2021/072966
PCT Pub. Date: Apr. 22, 2021

(65) Prior Publication Data
US 2021/0305334 A1    Sep. 30, 2021

(30) Foreign Application Priority Data

Oct. 15, 2019   (CN) .......................... 201910977077.7

(51) Int. Cl.
*H01L 27/32* (2006.01)
*H01L 51/50* (2006.01)
*H01L 51/56* (2006.01)

(52) U.S. Cl.
CPC ...... *H01L 27/3246* (2013.01); *H01L 27/3218* (2013.01); *H01L 51/5088* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 8,593,056 B2 | 11/2013 | Domoto | |
| 2013/0168715 A1 | 7/2013 | Yoshioka et al. | |
| 2013/0234129 A1* | 9/2013 | Yamada | H05B 33/22 438/35 |

(Continued)

FOREIGN PATENT DOCUMENTS

| | | |
|---|---|---|
| CN | 102461334 | 5/2012 |
| CN | 104602380 | 5/2015 |
| CN | 104681734 | 6/2015 |

(Continued)

*Primary Examiner* — Michelle Mandala

(57) ABSTRACT

A display panel and a method of manufacturing the same are provided. The display pane includes an array substrate; a plurality of pixel defining portions, the pixel defining portions spaced apart from each other on the array substrate; a plurality of pixel units, each of the pixel units including: a plurality of sub-pixels, each of the sub-pixels disposed between corresponding adjacent pixel defining portions, each of the sub-pixels including a light emitting layer for emitting light and a hole injection layer. A thickness of the hole injection layer is positively correlated with a wavelength of light emitted by a corresponding light emitting layer.

10 Claims, 2 Drawing Sheets

(56) References Cited

U.S. PATENT DOCUMENTS

2014/0061592 A1    3/2014  Liu et al.

FOREIGN PATENT DOCUMENTS

| CN | 105870353 | 8/2016 |
| CN | 106025091 | 10/2016 |
| CN | 107221605 | 9/2017 |
| CN | 107507917 | 12/2017 |
| CN | 108231848 | 6/2018 |
| CN | 109037301 | 12/2018 |
| CN | 109616500 | 4/2019 |

* cited by examiner

DISPLAY PANEL AND METHOD OF MANUFACTURING THE SAME

RELATED APPLICATIONS

This application is a National Phase of PCT Patent Application No. PCT/CN2019/126175 having International filing date of Dec. 18, 2019, which claims the benefit of priority of Chinese Patent Application No. 201910977077.7 filed on Oct. 15, 2019. The contents of the above applications are all incorporated by reference as if fully set forth herein in their entirety.

FIELD AND BACKGROUND OF THE INVENTION

The present disclosure relates to the field of display technologies, and more particularly to a display panel and a method of manufacturing the same.

With the development of display panel technology, organic light emitting diodes (OLEDs) have many advantages such as self-luminescence, low power consumption, and wide color gamut. Therefore, OLEDs are becoming more and more widely used.

Large-sized OLEDs generally use a vapor-deposited white OLED device with a filter structure. However, in order to increase a light extraction rate, it is required that the above-mentioned large-sized OLEDs require a white light OLED device to simultaneously match optical paths of red, green, and blue light. Existing large size OLEDs typically employ an increase in the thickness of the white OLED device to enable the white OLED device to simultaneously match the optical paths of three color lights. However, the above scheme of increasing the thickness of the white OLED device also causes it to require a higher driving voltage.

SUMMARY OF THE INVENTION

An object of the present invention is to provide a display panel and a method of manufacturing the same, which can reduce a driving voltage of the display panel by reducing a thickness of a hole injection layer.

An embodiment of the present invention provides a display panel, comprising: an array substrate; a plurality of pixel defining portions, wherein the pixel defining portions are spaced apart from each other on the array substrate; a plurality of pixel units, wherein each of the pixel units comprises: a plurality of sub-pixels, each of the sub-pixels disposed between corresponding adjacent pixel defining portions, each of the sub-pixels comprising: a light emitting layer for emitting light; and a hole injection layer, wherein a thickness of the hole injection layer is positively correlated with a wavelength of light emitted by a corresponding light emitting layer; wherein a constituent material of the hole injection layer comprises an ink, and a mass ratio of the ink in the hole injection layer ranges from 1% to 10%; and wherein the constituent material of the hole injection layer comprises a nano material.

In an embodiment of the present invention, each of the pixel units comprises: a blue sub-pixel, the hole injection layer in the blue sub-pixel having a first thickness; a green sub-pixel, the hole injection layer in the green sub-pixel having a second thickness; and a red sub-pixel, the hole injection layer in the red sub-pixel having a third thickness; wherein the first thickness, the second thickness, and the third thickness are sequentially increased.

In an embodiment of the present invention, a mass ratio of the nano material in the hole injection layer ranges from 0.5% to 5%.

In an embodiment of the present invention, the nano material is a nanosphere having a particle size ranging from 10 nanometers to 50 nanometers.

In an embodiment of the present invention, the hole injection layer has a thickness ranging from 10 nanometers to 500 nanometers.

An embodiment of the present invention further provides a display panel, comprising: an array substrate; a plurality of pixel defining portions, wherein the pixel defining portions are spaced apart from each other on the array substrate; a plurality of pixel units, wherein each of the pixel units comprises: a plurality of sub-pixels, each of the sub-pixels disposed between corresponding adjacent pixel defining portions, each of the sub-pixels comprising: a light emitting layer for emitting light; and a hole injection layer, wherein a thickness of the hole injection layer is positively correlated with a wavelength of light emitted by a corresponding light emitting layer.

In an embodiment of the present invention, each of the pixel units comprises: a blue sub-pixel, the hole injection layer in the blue sub-pixel having a first thickness; a green sub-pixel, the hole injection layer in the green sub-pixel having a second thickness; and a red sub-pixel, the hole injection layer in the red sub-pixel having a third thickness; wherein the first thickness, the second thickness, and the third thickness are sequentially increased.

In an embodiment of the present invention, a constituent material of the hole injection layer comprises an ink, and a mass ratio of the ink in the hole injection layer ranges from 1% to 10%.

In an embodiment of the present invention, the constituent material of the hole injection layer comprises a nano material.

In an embodiment of the present invention, a mass ratio of the nano material in the hole injection layer ranges from 0.5% to 5%.

In an embodiment of the present invention, the nano material is a nanosphere having a particle size ranging from 10 nanometers to 50 nanometers.

In an embodiment of the present invention, the hole injection layer has a thickness ranging from 10 nanometers to 500 nanometers.

An embodiment of the present invention further provides a method of manufacturing a display panel, comprising steps of: providing an array substrate; forming a plurality of pixel defining portions on the array substrate, wherein the pixel defining portions are spaced apart from each other on the array substrate; forming a plurality of pixel units on the array substrate, wherein each of the pixel units comprises a plurality of sub-pixels, each of the sub-pixels is disposed between corresponding adjacent pixel defining portions, each of the sub-pixels comprises a light emitting layer for emitting light and a hole injection layer, and a thickness of the hole injection layer is positively correlated with a wavelength of light emitted by a corresponding light emitting layer.

In an embodiment of the present invention, in the step of forming a plurality of pixel units on the array substrate, each of the pixel units comprising a plurality of sub-pixels, each of the sub-pixels disposed between corresponding adjacent pixel defining portions, each of the sub-pixels comprising a light emitting layer for emitting light and a hole injection layer, and a thickness of the hole injection layer positively correlated with a wavelength of light emitted by a corresponding light emitting layer, the method comprises: obtaining a preset quality ink according to a luminescent color of the light emitting layer corresponding to the hole injection layer; performing inkjet printing between adjacent pixel defining portions using the ink to form the hole injection layer; and forming a corresponding light emitting layer on the hole injection layer.

In an embodiment of the present invention, a mass ratio of the ink in the hole injection layer ranges from 1% to 10%.

In an embodiment of the present invention, before the step of obtaining the preset quality ink according to the luminescent color of the light emitting layer corresponding to the hole injection layer, the method further comprises: doping a nano material in the ink.

In an embodiment of the present invention, a mass ratio of the nano material in the hole injection layer ranges from 0.5% to 5%.

In an embodiment of the present invention, the nano material is a nanosphere having a particle size ranging from 10 nanometers to 50 nanometers.

In an embodiment of the present invention, the hole injection layer has a thickness ranging from 10 nanometers to 500 nanometers.

In an embodiment of the present invention, each of the pixel units comprises: a blue sub-pixel, the hole injection layer in the blue sub-pixel having a first thickness; a green sub-pixel, the hole injection layer in the green sub-pixel having a second thickness; and a red sub-pixel, the hole injection layer in the red sub-pixel having a third thickness; wherein the first thickness, the second thickness, and the third thickness are sequentially increased.

Beneficial effects of the present application are that: in contrast to the prior art, an embodiment of the invention provides a display panel and a method of manufacturing the same. By setting the thickness of the hole injection layer according to the wavelength of light emitted by the corresponding light emitting layer of the hole injection layer, the thickness of an entire display panel can be effectively reduced.

BRIEF DESCRIPTION OF THE SEVERAL VIEWS OF THE DRAWINGS

In order to make the above-mentioned contents of the present invention more comprehensible, the preferred embodiments are described below, and in conjunction with the accompanying drawings, the detailed description is as follows.

DESCRIPTION OF SPECIFIC EMBODIMENTS OF THE INVENTION

Figure 1:
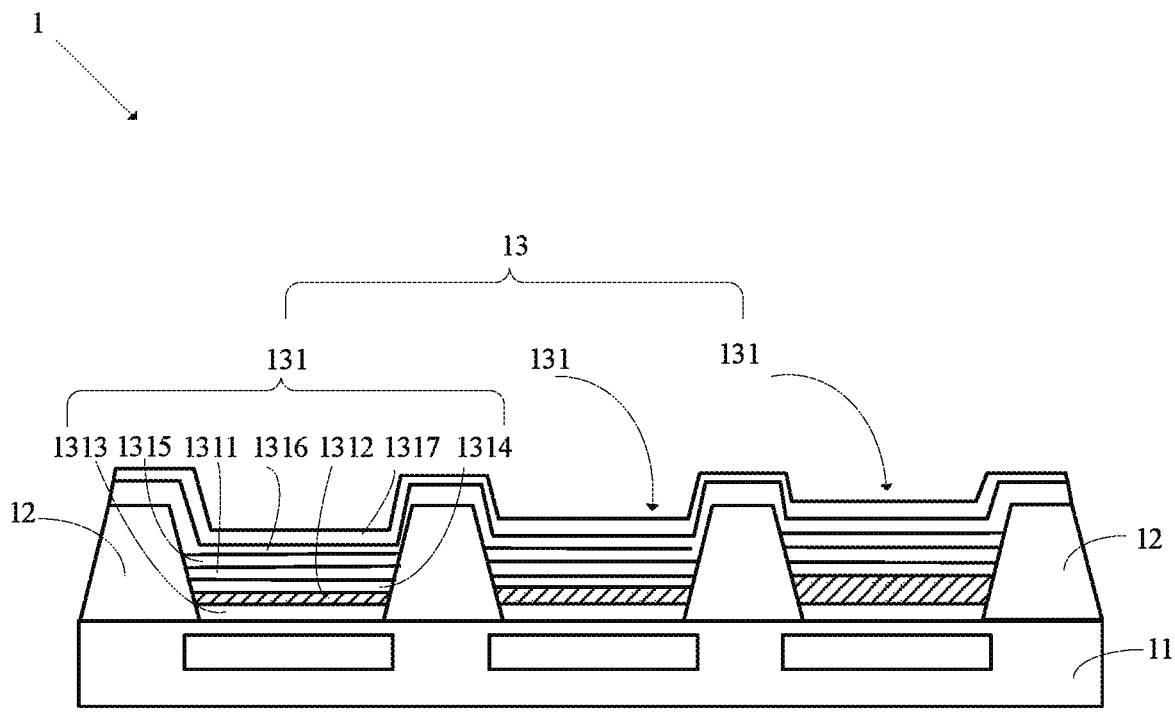
FIG. 1 is a schematic structural diagram of a display panel according to an embodiment of the present invention.

The following description of the various embodiments is provided to illustrate the specific embodiments of the present invention. The directional terms mentioned in the present invention, such as "upper", "lower", "front", "rear", "left", "right", "inside", "outside", "side", etc., are merely referring to the directions of the additional drawings. Therefore, the directional terminology used is for the purpose of illustration and understanding of the present invention.

In the figures, structurally similar elements are denoted by the same reference numerals.

References to "an embodiment" herein mean that a particular feature, structure, or characteristic described in connection with the embodiments can be included in at least one embodiment of the present invention. The appearances of the phrases in various places in the specification are not necessarily referring to the same embodiments, and are not exclusive or alternative embodiments that are mutually exclusive. Those skilled in the art will understand and implicitly understand that the embodiments described herein can be combined with other embodiments.

Referring to FIG. 1, FIG. 1 is a schematic structural diagram of a display panel according to an embodiment of the present invention. A display panel 1 includes an array substrate 11, a plurality of pixel defining portions 12, and a plurality of pixel units 13.

The array substrate 11 includes a substrate and a thin film transistor layer. The substrate is used to carry a structure such as thin film transistors, pixel defining portions 12, and pixel units 13 thereon. The thin film transistor layer includes a plurality of thin film transistors for controlling the pixel units 13 to emit light.

The plurality of pixel defining portions 12 are spaced apart from each other on the array substrate 11. The pixel defining portions 12 are configured to separate sub-pixels 131 in the pixel units 13.

As shown in FIG. 1, each of the pixel units 13 includes a plurality of sub-pixels 131. Each of the sub-pixels 131 is disposed between the corresponding adjacent pixel defining portions 12. Each of the sub-pixels 131 includes a light emitting layer 1311 and a hole injection layer 1312. Specifically, each of the sub-pixels 131 further includes an anode layer 1313, a hole transport layer 1314, an electron transport layer 1315, an electron injection layer 1316, and a cathode layer 1317.

The anode layer 1313 is disposed on the array substrate 11, and the anode layer 1313 is for providing holes. The hole injection layer 1312 and the hole transport layer 1314 are sequentially stacked on the anode layer 1313. The hole injection layer 1312 is for injecting holes generated in the anode layer 1313 into the hole transport layer 1314 for transporting holes to the light emitting layer 1311.

The electron transport layer 1315, the electron injection layer 1316, and the cathode layer 1317 are sequentially stacked on the light emitting layer 1311. Cathode layer 1317 is used to provide electrons. The electron injection layer 1316 is for injecting electrons generated by the cathode layer 1317 into the electron transport layer 1315. The electron transport layer 1315 is for transmitting electrons to the light emitting layer 1311.

The light emitting layer 1311 is made of a light emitting material that emits light under the action of electrons and holes.

It should be noted that a thickness of the hole injection layer 1312 is positively correlated with a wavelength of light emitted by a corresponding light emitting layer 1311, that is, the longer the wavelength of the light emitted by the corresponding light emitting layer 1311, the more the thickness of the hole injection layer 1312 is. In an embodiment, as shown in FIG. 1, each of the pixel units 13 includes, in order from left to right, a blue sub-pixel that emits blue light, a green sub-pixel that emits green light, and a red sub-pixel that emits red light. The hole injection layer 1312 in the blue sub-pixel has a first thickness, the hole injection layer 1312 in the green sub-pixel has a second thickness, and the hole injection layer 1312 in the red sub-pixel has a third thickness. Since a wavelength of blue light is smaller than a wavelength of green light, a wavelength of green light is smaller than a wavelength of red light, so the first thickness is smaller than the second thickness, and the second thickness is smaller than the third thickness, that is, the first thickness, the second thickness, and the third thickness are sequentially increased.

In summary, the thickness of the hole injection layer 1312 ranges from 10 to 500 nanometers, and is specifically set according to actual thickness requirements. In an embodiment, the thickness of the hole injection layer 1312 may be limited to between 100 nanometers and 300 nanometers.

A constituent material of the hole injection layer 1312 includes an ink, and a mass ratio of the ink in the hole injection layer 1312 ranges from 1% to 10%.

The constituent material of the hole injection layer 1312 also includes a nano material. A mass ratio of the nano material in the hole injection layer 1312 ranges from 0.5% to 5%. In one embodiment, the nano material has a refractive index greater than 2, specifically a zirconia nanomaterial and/or a silicon oxide nanomaterial. The nano material may be distributed in the hole injection layer 1312 in a different shape, such as a nano material in the shape of a sphere, a cone, a cuboid, a cube, or the like. The shape of the nano material is determined according to needs of a light refraction path. In an embodiment, when the nano material is a nanosphere, the nanosphere has a particle size ranging from 10 nanometers to 50 nanometers.

Further, the constituent material of the hole injection layer 1312 further includes an organic material. In the hole injection layer 1312, the organic material is continuous and does not affect conductivity of the hole injection layer 1312.

In one embodiment, the hole injection layer 1312 is formed by inkjet printing in all the film layers of the sub-pixel 131, and the light emitting layer 1311, the anode layer 1313, the hole transport layer 1314, the electron transport layer 1315, the electron injection layer 1316, and the cathode layer 1317 can be formed by vacuum evaporation.

The display panel 1 also includes a color filter. In an embodiment, as shown in FIG. 1, the display panel 1 is a bottom light emitting device, that is, a color filter is disposed on a side of the light emitting layer 1311 adjacent to the array substrate 11. In combination with the nano material doped in the hole injection layer 1312, since the nano material can reduce a refractive index of light, a light extraction rate of the display panel 1 can be improved. It should be noted that, in this embodiment, the display panel 1 may also be a top light emitting device, and the type of light emitted by the display panel 1 is not limited herein.

The display panel provided by an embodiment of the present invention sets the thickness of the hole injection layer according to the wavelength of the light emitted by the light emitting layer, and reduces a driving voltage of the display panel by reducing the thickness of the hole injection layer.

Figure 2:
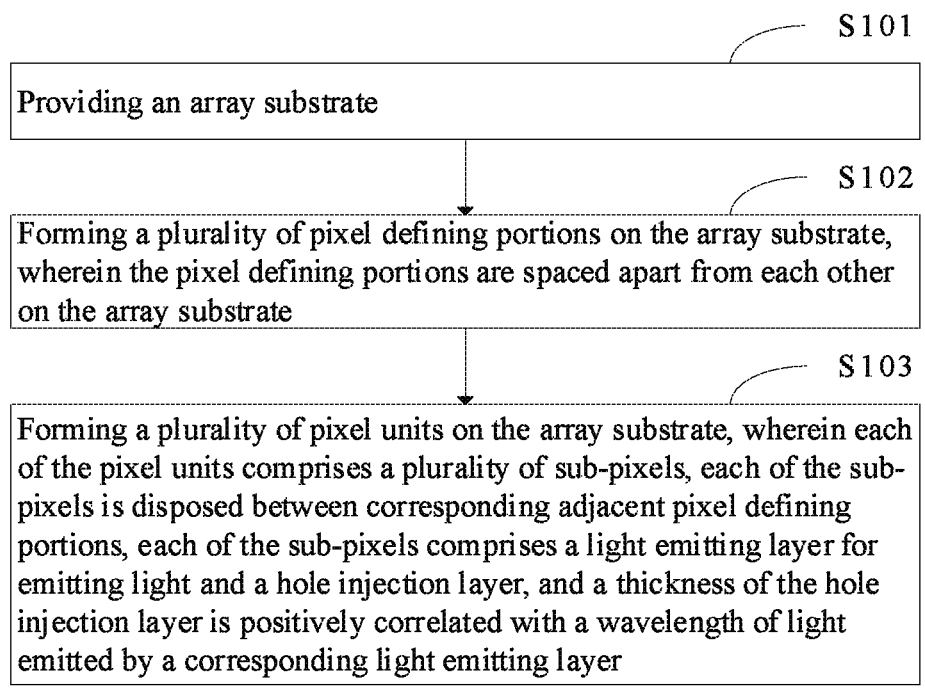
FIG. 2 is a schematic flowchart of a method of manufacturing a display panel according to an embodiment of the present invention.

An embodiment of the present invention further provides a method of manufacturing a display panel, which is used for manufacturing the above display panel. Referring to FIG. 2, FIG. 2 is a schematic flowchart of a method of manufacturing a display panel according to an embodiment of the present invention.

Step S101, providing an array substrate.

The array substrate includes a substrate and a thin film transistor layer. The substrate is used to carry a structure such as thin film transistors, pixel defining portions, and pixel units thereon. The thin film transistor layer includes a plurality of thin film transistors for controlling the pixel units to emit light.

Step S102, forming a plurality of pixel defining portions on the array substrate, wherein the pixel defining portions are spaced apart from each other on the array substrate.

As shown in FIG. 2, the plurality of pixel defining portions 12 are spaced apart from each other on the array substrate 11. The pixel defining portions 12 are configured to separate sub-pixels 131 in the pixel units 13.

Step S103, forming a plurality of pixel units on the array substrate, wherein each of the pixel units comprises a plurality of sub-pixels, each of the sub-pixels is disposed between corresponding adjacent pixel defining portions, each of the sub-pixels comprises a light emitting layer for emitting light and a hole injection layer, and a thickness of the hole injection layer is positively correlated with a wavelength of light emitted by a corresponding light emitting layer.

As shown in FIG. 1, each of the pixel units 13 includes a plurality of sub-pixels 131. Each of the sub-pixels 131 is disposed between the corresponding adjacent pixel defining portions 12. Each of the sub-pixels 131 includes a light emitting layer 1311 and a hole injection layer 1312. Specifically, each of the sub-pixels 131 further includes an anode layer 1313, a hole transport layer 1314, an electron transport layer 1315, an electron injection layer 1316, and a cathode layer 1317.

The anode layer 1313 is disposed on the array substrate 11, and the anode layer 1313 is for providing holes. The hole injection layer 1312 and the hole transport layer 1314 are sequentially stacked on the anode layer 1313. The hole injection layer 1312 is for injecting holes generated in the anode layer 1313 into the hole transport layer 1314 for transporting holes to the light emitting layer 1311.

The electron transport layer 1315, the electron injection layer 1316, and the cathode layer 1317 are sequentially stacked on the light emitting layer 1311. Cathode layer 1317 is used to provide electrons. The electron injection layer 1316 is for injecting electrons generated by the cathode layer 1317 into the electron transport layer 1315. The electron transport layer 1315 is for transmitting electrons to the light emitting layer 1311.

The light emitting layer 1311 is made of a light emitting material that emits light under the action of electrons and holes.

It should be noted that a thickness of the hole injection layer 1312 is positively correlated with a wavelength of light emitted by a corresponding light emitting layer 1311, that is, the longer the wavelength of the light emitted by the corresponding light emitting layer 1311, the more the thickness of the hole injection layer 1312 is. In an embodiment, as shown in FIG. 1, each of the pixel units 13 includes, in order from left to right, a blue sub-pixel that emits blue light, a green sub-pixel that emits green light, and a red sub-pixel that emits red light. The hole injection layer 1312 in the blue sub-pixel has a first thickness, the hole injection layer 1312 in the green sub-pixel has a second thickness, and the hole injection layer 1312 in the red sub-pixel has a third thickness. Since a wavelength of blue light is smaller than a wavelength of green light, a wavelength of green light is smaller than a wavelength of red light, so the first thickness is smaller than the second thickness, and the second thickness is smaller than the third thickness, that is, the first thickness, the second thickness, and the third thickness are sequentially increased.

Figure 3:
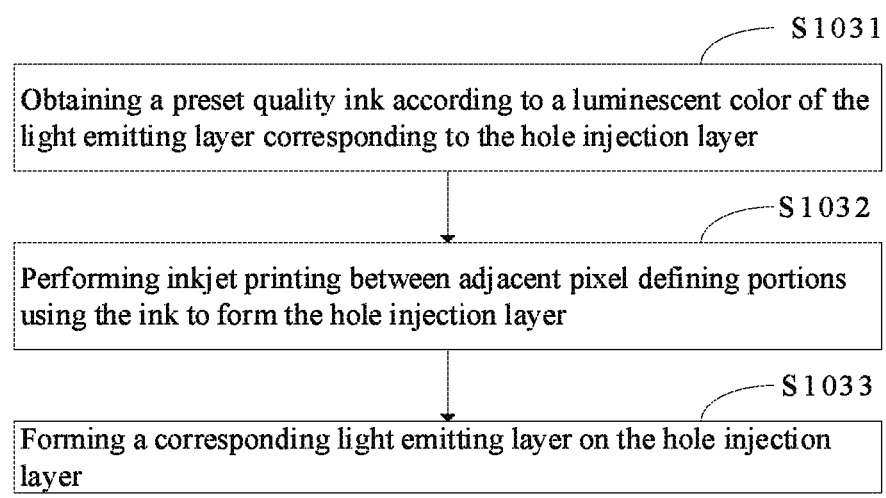
FIG. 3 is another schematic flowchart of a method of manufacturing a display panel according to an embodiment of the present invention.

Process steps of the hole injection layer are described in detail below. As shown in FIG. 3, the process steps of the hole injection layer specifically include:

Step S1031, obtaining a preset quality ink according to a luminescent color of the light emitting layer corresponding to the hole injection layer.

Assuming that a luminescent color of the light emitting layer corresponding to the hole injection layer is blue, the ink of a first preset quality is obtained. Assuming that the luminescent color of the light emitting layer corresponding to the hole injection layer is green, the ink of a second preset quality is obtained. Assuming that the luminescent color of the light emitting layer corresponding to the hole injection layer is red, the ink of a third preset quality is obtained. Since a wavelength of blue light is smaller than a wavelength of green light, and a wavelength of green light is smaller than a wavelength of red light, the first preset quality is smaller than the second preset quality, and the second preset quality is smaller than the third preset quality. In general, a mass ratio of the ink in the hole injection layer ranges from 1% to 10%.

It should be noted that, before the step S1031, the nano material may be doped in the ink first. A mass ratio of the nano material in the hole injection layer 1312 ranges from 0.5% to 5%. In one embodiment, the nano material has a refractive index greater than 2, specifically a zirconia nanomaterial and/or a silicon oxide nanomaterial. The nano material may be distributed in the hole injection layer 1312 in a different shape, such as a nano material in the shape of a sphere, a cone, a cuboid, a cube, or the like. The shape of the nano material is determined according to needs of a light refraction path. In an embodiment, when the nano material is a nanosphere, the nanosphere has a particle size ranging from 10 nanometers to 50 nanometers. The nano material can reduce a refractive index of the hole injection layer 1312 and increase a light extraction coefficient of the display panel.

Step S1032, performing inkjet printing between adjacent pixel defining portions using the ink to form the hole injection layer.

The thickness of the hole injection layer 1312 ranges from 10 to 500 nanometers. In one embodiment, the thickness of the hole injection layer 1312 may be limited to between 100 nanometers and 300 nanometers.

Step S1033, forming a corresponding light emitting layer on the hole injection layer.

A constituent material of the hole injection layer 1312 includes an organic light emitting material, specifically, a blue organic light emitting material, a green organic light emitting material, or a red organic light emitting material. The organic light emitting material emits light of a corresponding color under the action of holes and electrons.

In one embodiment, the hole injection layer 1312 is formed by inkjet printing in all the film layers of the sub-pixel 131, and the light emitting layer 1311, the anode layer 1313, the hole transport layer 1314, the electron transport layer 1315, the electron injection layer 1316, and the cathode layer 1317 can be formed by vacuum evaporation.

The method of manufacturing display panel provided by an embodiment of the present invention sets the thickness of the hole injection layer according to the wavelength of the light emitted by the light emitting layer, and reduces a driving voltage of the display panel by reducing the thickness of the hole injection layer.

In view of the foregoing, although the present invention has been described above in the preferred embodiments, the preferred embodiments are not intended to limit the present invention. Various modifications and refinements can be made by those skilled in the art without departing from the spirit and scope of the present invention. The protection scope of the present invention is therefore defined by the scope of the claims.

What is claimed is:

1. A display panel, comprising:
   an array substrate;
   a plurality of pixel defining portions, wherein the pixel defining portions are spaced apart from each other on the array substrate;
   a plurality of pixel units, wherein each of the pixel units comprises:
   a plurality of sub-pixels, each of the sub-pixels disposed between corresponding adjacent pixel defining portions, each of the sub-pixels comprising:
   a light emitting layer for emitting light; and
   a hole injection layer, wherein a thickness of the hole injection layer is positively, correlated with a wavelength of light emitted by a corresponding light emitting layer;
   wherein a constituent material of the hole injection layer comprises an ink, a nano material, and an organic material, a mass ratio of the ink in the hole injection layer ranges from 1% mole %; to 10% mole %, a mass ratio of the nano material in the hole injection layer ranges from 0.5% mole % to 5% mole %, and the organic material is continuous in the hole injection layer.

2. The display panel according to claim 1, wherein each of the pixel units comprises:
   a blue sub-pixel, the hole injection layer in the blue sub-pixel having a first thickness;
   a green sub-pixel, the hole injection layer in the green sub-pixel having a second thickness; and
   a red sub-pixel, the hole injection layer in the red sub-pixel having a third thickness;
   wherein the first thickness, the second thickness, and the third thickness are sequentially increased.

3. The display panel according to claim 1, wherein the nano material is a nanosphere having a particle size ranging from 10 nanometers to 50 nanometers.

4. The display panel according to claim 1, wherein the hole injection layer has a thickness ranging from 10 nanometers to 500 nanometers.

5. A method of manufacturing a display panel, comprising steps of:
   providing an array substrate;
   forming a plurality of pixel defining portions on the array substrate, wherein the pixel defining portions are spaced apart from each other on the array substrate;
   forming a plurality of pixel units on the array substrate, wherein each of the pixel units comprises a plurality of sub-pixels, each of the sub-pixels is disposed between corresponding adjacent pixel defining portions, each of the sub-pixels comprises a light emitting layer for emitting light and a hole injection layer, and a thickness of the hole injection layer is positively correlated with a wavelength of light emitted by a corresponding light emitting layer;
   wherein a constituent material of the hole injection layer comprises an ink, a nano material, and an organic material, a mass ratio of the ink in the hole injection layer ranges from 1% mole % to 10% mole %, a mass ratio of the nano material in the hole injection layer ranges from 0.5% mole % to 5% mole %, and the organic material is continuous in the hole injection layer.

6. The method of manufacturing the display panel according to claim 5, wherein in the step of forming a plurality of pixel units on the array substrate, each of the pixel units comprising a plurality of sub-pixels, each of the sub-pixels disposed between corresponding adjacent pixel defining portions, each of the sub-pixels comprising a light emitting layer for emitting light and a hole injection layer, and a thickness of the hole injection layer positively correlated with a wavelength of light emitted by a corresponding light emitting layer, the method comprises:

obtaining a preset quality ink according to a luminescent color of the light emitting layer corresponding to the hole injection layer;

performing inkjet printing between adjacent pixel defining portions using the ink to form the hole injection layer; and forming a corresponding light emitting layer on the hole injection layer.

7. The method of manufacturing the display panel according to claim 6, wherein before the step of obtaining the preset quality ink according to the luminescent color of the light emitting layer corresponding to the hole injection layer, the method further comprises:

doping the nano material in the ink.

8. The method of manufacturing the display panel according to claim 7, wherein the nano material is a nanosphere having a particle size ranging from 10 nanometers to 50 nanometers.

9. The method of manufacturing the display panel according to claim 5, wherein the hole injection layer has a thickness ranging from 10 nanometers to 500 nanometers.

10. The method of manufacturing the display panel according to claim 5, wherein each of the pixel units comprises:

a blue sub-pixel, the hole injection layer in the blue sub-pixel having a first thickness;

a green sub-pixel, the hole injection layer in the green sub-pixel having a second thickness; and a red sub-pixel, the hole injection layer in the red sub-pixel having a third thickness;

wherein the first thickness, the second thickness, and the third thickness are sequentially, increased.

* * * * *